INVENTORS
BOYD CORNELISON,
MORTON E. JONES,
JAMES T. LINEBACK,
ELMER A. WOLFF, JR.,
SAMUEL W. BARCUS, JR.,
FRANK A. HORAK AND
NORMAN S. INCE

BY Stevens, Davis, Miller & Mosher
ATTORNEYS

Feb. 5, 1963 B. CORNELISON ETAL 3,076,253

MATERIALS FOR AND METHODS OF MANUFACTURING SEMICONDUCTOR DEVICES

Filed March 10, 1955

2 Sheets-Sheet 2

INVENTORS
BOYD CORNELISON,
MORTON E. JONES,
JAMES T. LINEBACK,
ELMER A. WOLFF, JR.,
SAMUEL W. BARCUS, JR.,
FRANK A. HORAK AND
NORMAN S. INCE

BY Stevens, Davis, Miller and Mosher
ATTORNEYS

United States Patent Office 3,076,253

Patented Feb. 5, 1963

3,076,253

MATERIALS FOR AND METHODS OF MANUFACTURING SEMICONDUCTOR DEVICES

Boyd Cornelison, Morton E. Jones, James T. Lineback, Elmer A. Wolff, Jr., Samuel W. Barcus, Jr., Frank A. Horak, and Norman S. Ince, Dallas, Tex., assignors to Texas Instruments Incorporated, Dallas, Tex., a corporation of Delaware Filed Mar. 10, 1955, Ser. No. 493,478
4 Claims. (Cl. 29—25.3)

This invention relates to materials for and methods of manufacturing semiconductor devices and more specifically to etch-resistant materials and the use of etch-resistant materials in manufacturing semiconductor devices to avoid the necessity of masking the portions of such devices which would be damaged or destroyed in the etching process. This invention particularly includes methods of manufacturing transistor semiconductor devices in large quantities and using etch-resistant materials in their manufacture.

As previously used, it is the general practice in producing semiconductor crystals to introduce a quantity of semiconductor material into a crystal puller and, after heating the material until it has melted, to grow from the melt, either a single crystal of one conductivity type or a crystal with one or more layers of a conductivity type different from the conductivity type of the main body of the crystal. The grown crystal is then sawed into sections of a thickness suitable for dicing into squares for diodes or for further sawing into bars for transistors. However, in producing such dice and bars, the surfaces of the semiconductor material are left in a disturbed and disordered state due to the sawing and dicing operations.

It has long been known in the semiconductor art that proper treatment of semiconductor surfaces is necessary, such as by etching, to remove the superficial layer of disturbed material left by the mechanical preparation of the semiconductor crystal and for exposing the undisturbed crystal body underneath. The reason for this is that, in the case of junction diodes and photo transistors, one of the design objects is achievement of high reverse resistance and the accomplishment of this objective is incompatible with leaving a layer of disordered material on the surface of the bar or dice where it could act as a low-reverse-resistance bridge bypassing the rest of the junction. In the case of junction transistors, such a layer would afford a partially short-circuiting path around the junctions where relatively large diffusion currents could flow thereby leading to high values of collector current and to poor emitter control.

Apart from disordered layers left by mechanical preparation, however, there is another reason for etching those semiconductors where an impurity material is alloyed with the semiconductor material to produce a p-n junction. In this situation, the impurity material often overlaps the junction and must be etched to eliminate any short-circuiting path which might be formed.

Etching the surfaces of a semiconductor, though, has other purposes than those arising out of the immediate electrical requirements of the semi-conductor devices themselves. The microcracks and other structural flaws of a disordered layer may serve as a harboring place for adsorbed moisture and foreign ions picked up from the cutting and lapping liquids. Unless removed, this moisture and the foreign ion impurities might cause chemical changes affecting the characteristics of the device at some later time. The apices of cracks extending down into the underlying crystal act as concentrating points for mechanical stresses. Further, the separation of the electronic energy bands in the semiconductor material is pressure sensitive to a measurable degree and the pressure fluctuations at these points could conceivably cause fluctuations in local resistivity and hence generate excess noise. Another possible source of noise might be the thermal fluctuations of the widths of such crackse lying across current paths, with consequent fluctuations in their impedance to current flow.

Before the semiconductor material can be etched, however, there are certain problems arising from the characteristics of the material which must be considered. First, mechanical or chemical handling of semiconductor material after it has been etched causes surface contamination which may, like the disordered surface layer and overlapping impurity material, result in a partially short-circuiting path around a junction. Consequently, to avoid surface contamination, it has been the practice to solder the electrical lead or leads to a semiconductor device before it is etched. This practice, however, gives rise to a second problem because the prior art solder connections and electrical leads are attacked by the etchant and not only are the solder connections and leads either damaged or destroyed, but the etchant is contaminated by the dissolved solder and other materials thus making it of little value for further use as an etchant. The prior art approach to this problem has been to mask these portions of a semiconductor device with a compound impervious to the action of the etch, such as a saturated solution of toluene and polystyrene chips. A dye is included in the compound, usually red in color, to make the masked portions of the semiconductor device clearly visible. Because of the small size of the devices, the masking material must be applied by hand to make certain that the semiconductor surfaces are not covered in the masking operation. After masking, the semiconductor devices are placed in an etch generally consisting of concentrated nitric acid, hydrofluoric acid, glacial acetic acid and liquid bromine for a time sufficient to remove the disordered surface of the semiconductor, which time varies from twenty to ninety seconds. When the etching step has been completed, the semiconductor devices are removed from the etch and the masking compound must then be stripped from the devices. A solvent such as carbon tetrachloride is generally used for this purpose. If the device is a transistor, the connection to the base layer of the transistor has not usually been made in this prior art method and great care must be used in attaching the base lead to avoid contamination of the etched surfaces.

The process of masking the portions of a semiconductor device which would be damaged in the etching process and then subsequently stripping the masking material from the device is costly and time consuming. Consequently, the prior art has devised another method of etching, known as electrolytic etching, whereby semiconductor devices can be etched without masking. In the electrolytic process, a pair of small, shaped wires are positioned over a semiconductor device which has the electrical leads already attached and then a thin stream of electrolyte is caused to flow down the wires and over the semiconductor material. A current, whose path is provided by the leads, the semiconductor material, the electrolyte, and the wires, is applied in such a direction that the disordered surface of the semiconductor material is removed by the electrolyte etch. This method, too, has its disadvantages since the flow of the electrolyte must be carefully controlled to prevent it from spreading to the soldered joints of the device and damaging or destroying the electrical connections. Also, the rate of etch is comparatively slow because of the low currents which can be used to electro-etch the semiconductor device. A further complication results from the fact that, when the device to be etched is a transistor, the emitter and collector portions have different resistivities and consequently, different amounts of current flow in the emitter and collector portions of the bar. Therefore, the ends of the bar etch at different rates making it advantageous to use two different voltage sources to equalize the currents and produce equalized etching rates. Of course, the electrolytic process is limited to etching one semiconductor device at a time unless the electrolytic etching facilities are duplicated which makes it very expensive and complicated to etch a number of devices simultaneously.

According to the present invention, it has been discovered that certain materials are highly resistant to the action of etching fluids, particularly for the length of time required to etch semiconductor surfaces. As a consequence, the materials of this invention are neither damaged or destroyed in the etching process nor are they dissolved in the etching fluid. These etch-resistant materials are disclosed herein as platinum and gold, the platinum being used in the unalloyed state for the leads to semiconductor devices and the gold being used both for plating the materials commonly used for leads to semiconductor devices and in the form of a gold alloy for soldering either the platinum or gold plated leads to the devices. It has also been found that silver can be used, but the use of platinum and gold is preferred. Using the platinum or gold-plated leads and the gold alloy solder in the method of this invention, semiconductor devices are completely assembled before etching, so that they can be removed from the etch, rinsed, dried, and placed in suitable containers as completed devices. Further, this invention discloses methods particularly adapted for producing grown junction germanium and silicon transistor devices in large quantities. In one method, the components for a large number of transistors are assembled in the proper relationship and fused together in a single operation, while in another, the components are formed, assembled and fused in a continuous operation.

Accordingly, one of the principal objects of this invention is to provide an improved method of manufacturing semiconductor devices which eliminates costly and time consuming masking and stripping procedures and the single device etching limitation of the electrolytic etch process.

Another principal object of this invention is to provide an improved method of mass manufacturing transistor semiconductor devices which eliminates costly and time consuming masking and stripping procedures and the multiple sets of identical equipments required for electrolytically etching semiconductor devices in comparable quantities.

It is another principal object of this invention to disclose leads for semiconductor devices formed from etch-resistant material and etch-resistant alloys for soldering such leads to semiconductor devices.

It is another object of this invention to disclose a method of assembling the various components of junction transistor semiconductor devices in the proper relationship to one another and then fusing the components into either complete or partially complete transistor devices in a single operation. More specifically, by this method, the emitter, collector and base leads are attached to a large number of germanium or silicon junction transistor bars in a single fusing operation.

It is a still further object of this invention to provide a method of forming, assembling and fusing the components of junction transistors into complete transistor devices in a continuous operation.

The above objects will be clarified and other objects made known from the following discussion when taken in conjunction with the drawings in which.

Figures 7, 8, 9:
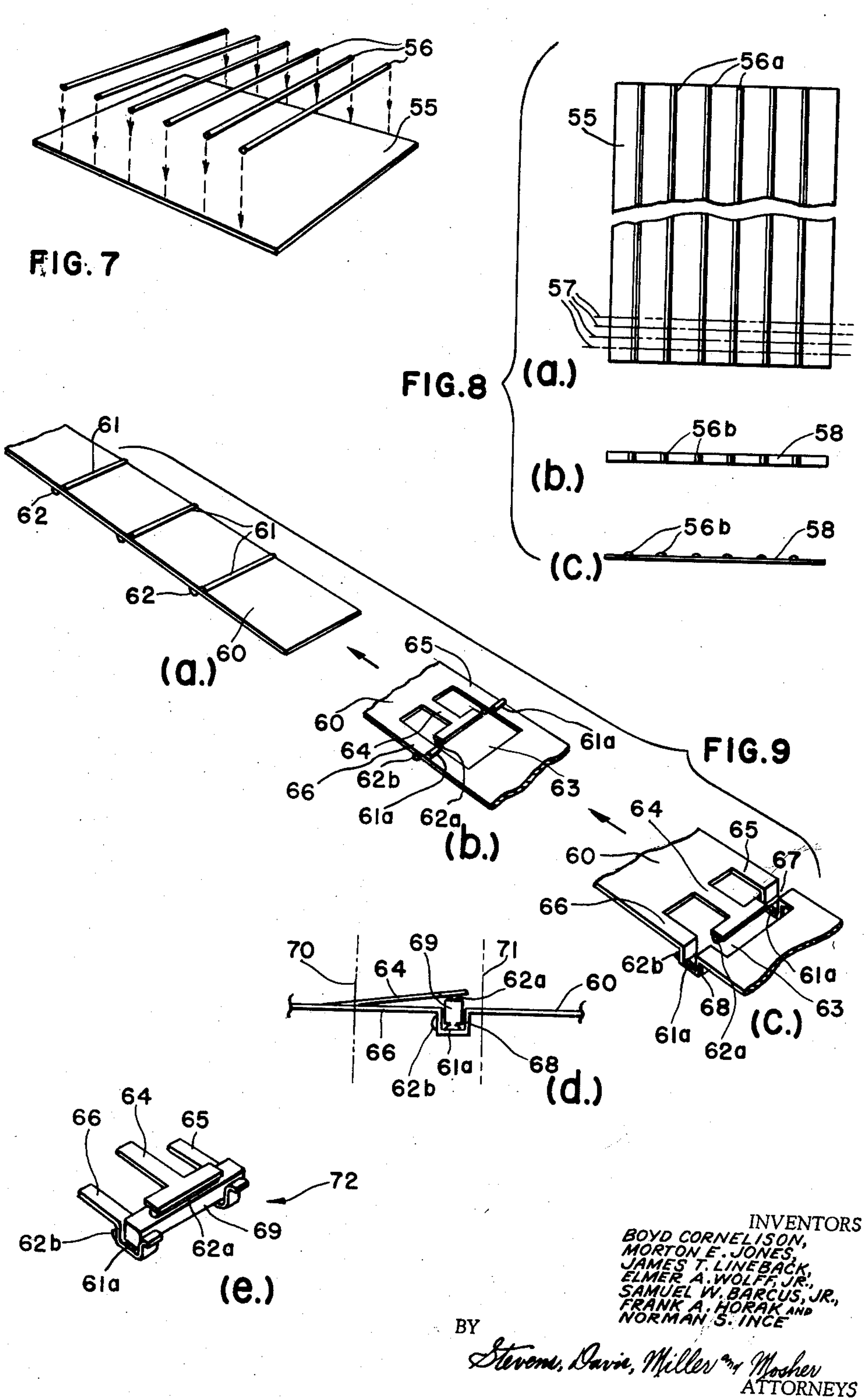
FIGURE 7 is a view in perspective of a sub-assembly representing another method of combining components to produce the assembly of FIGURE 4.

FIGURE 8 represents in FIGURE 8*a*, a plan view of the completed assembly of the components shown in FIGURE 7; in FIGURE 8*b*, a plan view of a strip taken from the assembly of FIGURE 8*a*; and in FIGURE 8*c*, a right-side elevational view of the strip of FIGURE 8*b*; and FIGURE 9 represents a continuous process for the production of transistors, illustrating in FIGURE 9*a*, a perspective view of a moving strip with solder and intermediate layer contact material "tacked" thereto but on opposite sides and at spaced intervals; in FIGURE 9*b*, a perspective view of a segment of the strip after it has been punched to remove all but a center T-shaped section and a narrow strip at either edge; in FIGURE 9*c*, a perspective view illustrating pockets formed in both of the narrow side strips of the segment of FIGURE 9*b* whereby the solder material is aligned in a vertical plane with the intermediate layer contact material; in FIGURE 9*d*, a side elevational view of the segment of FIGURE 9*c* illustrating a junction transistor bar supported at either end by the pockets in the narrow side strips and positioned underneath the cross-bar of the center T-section; and in FIGURE 9*e*, a perspective view showing a transistor sheared from the segment of FIGURE 9*d* of the moving strip.

Figure 1:
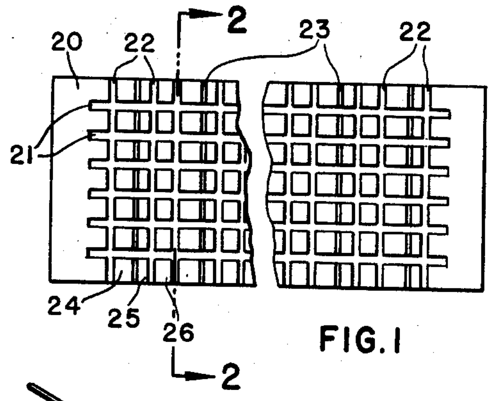
FIGURE 1 is a plan view of one form of container adapted for assembling the various transistor components in the proper relationship to each other.
Figures 2, 3, 4, 5, 6:
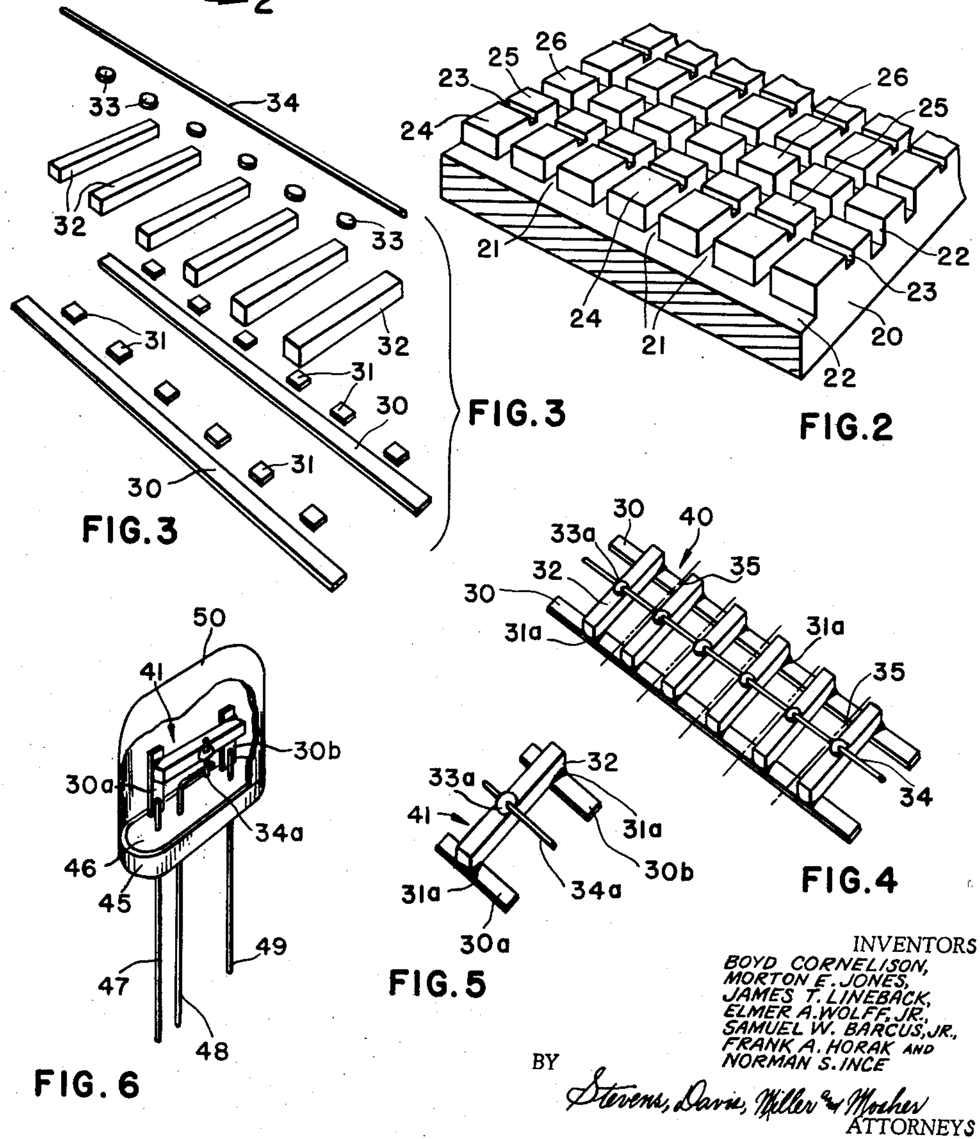
FIGURE 2 is a sectional view in perspective of the transistor component container taken along lines 2—2 of FIGURE 1.
FIGURE 3 is a perspective view of the components used in producing transistors and illustrates the relative relation of the components when assembled in the container of FIGURE 1.
FIGURE 4 is a plan view in perspective of the components of FIGURE 3 after the fusion process.
FIGURE 5 is an elevation view in perspective of a single transistor separated from the assembly of FIGURE 4.
FIGURE 6 is a cut-away view in perspective of the emitter, collector, and base leads of the transistor of FIGURE 5 welded to the transistor support header with a protective and sealing cover extending over the transistor.

Beginning now the description of the methods and apparatus of this invention as applied to the production of germanium transistors of the grown junction type, reference is first made to the container shown in FIGURES 1 and 2. The container of FIGURES 1 and 2, hereinafter referred to as a "boat," is constructed from graphite or any other suitable material which does not contaminate the semiconductor material and which can withstand high temperatures and can be easily worked. Boat 20 is rectangular in shape and a number of parallel slots 21 are cut longitudinally along boat 20 while a number of pairs of slots 22 are cut transversely across the boats and at right angles to the longitudinal slots 21. In cutting the pairs of transverse slots 22, each pair is separated from the next by the areas 26 raised in relation to the depth of the slots 22. Between each pair of transverse slots 22 is another transverse slot 23 which is separated from one or the other of the pair of slots 22 by the areas 24 and 25 raised in relation to the depth of slot 23. Referring to FIGURE 2, it can be seen that the longitudinal slots 21 and the pairs of transverse slots 22 are cut to the same depth from the surface of boat 20 while slot 23 is cut to a much shallower depth. The reason for this difference in the depth of slot 23 and the slots 21 and 22 will become apparent as the description proceeds. In this particular embodiment, the longitudinal slots 21 are cut to a width of .040"+, each slot of the pairs of transverse slots 22 is cut to a width of .035"+, and slot 23 is cut to a width of .005"+.

One feature which may be noted from FIGURES 1 and 2 is that slot 23 is not located at the same distance between each pair of slots 22 from one pair of slots to the next along the length of boat 20. Although this is not an essential feature of boat 20, it is desirable since the intermediate layer of a junction transistor is not grown in a perfectly straight line but rather in the form of a concave-spherical surface. Consequently, when the segment containing the intermediate layer is cut from a crystal, the intermediate layer does not always appear at the precise midpoint of the junction bars produced therefrom and this difference in location of the intermediate layer is compensated for by the varying location of slot 23 between the pairs of slots 22. It should be pointed out here that, although, the boat form of construction is very satisfactory, other forms can be used such as, for example, a suitably slotted cylinder.

Referring now to FIGURE 3 in conjunction with FIGURES 1 and 2, the components comprising the structure of a germanium transistor, and more particularly, an npn grown junction type transistor, are shown in the relation which they bear to each other when assembled in the slot arrangement of boat 20. The first components to be placed in the boat are the etch-resistant strips 30, one being placed in each slot of the pairs of transverse slots 22. The etch-resistant strips may be either strips of platinum aproximately .002″ thick by .035″ wide or any other suitable gold-plated metal of equivalent thickness and width. One of such other suitable metals may be gold-plated "kovar", "kovar" being the commercial name of an alloy disclosed in Patent No. 1,942,260 to Scott. Next, the gold alloy tabs 31, aproximately .035″ of .035″ square and .002″ thick, are positioned on the etch-resistant strips 30 at each intersection of the pairs of slots 22 with the longitudinal slots 21. The gold alloy of the tabs 31 constitutes a very essential feature of this invention since this alloy is not only etch-resistant but has the ability to wet both the etch-resistant strips 30 and the grown junction bars thereby providing a firm solder connection.

In the development of this gold alloy for use with germanium transistors, it was discovered that pure gold can be used as a solder connection but not very satisfactorily since gold in the unalloyed state absorbs germanium and thus makes germanium bars thin and brittle. In addition, gold has a high melting point and it was found that gold did not make an effective solder material until its melting point was approached. To overcome the high melting point and germanium absorbing properties of pure gold, germanium was alloyed in with the gold. However, it was further discovered that as the percentage of germanium in the alloy was increased, the hardness of the alloy itself was increased making it very difficult to use as a soldering material. Another feature developed in the process of experimenting with the gold alloy was the desirability of introducing impurities into the alloy of the same impurity type as the portion of the bar to which the solder connection was to be made. For example, in an npn grown junction germanium transistor bar, it was found desirable to add a certain percentage of impurities from the fifth group of the periodic table to provide n-type conductivity in the gold alloy. Consequently, in its preferred form for npn grown junction germanium transistors, the gold alloy consists of 3% germanium, 96.9% gold, and 0.1% antimony. The percentage of antimony in the gold alloy can be increased from 0.1% antimony to 0.5% antimony but it too, like the germanium, increases the hardness and brittleness of the alloy. Beyond the preferred alloy, it has been found that the composition of the gold alloy may vary from 99.5%–99.9% gold and 0.1%–0.5% antimony to 12% germanium, 87.5%–87.9% gold and 0.1%–0.5% antimony and still be satisfactory for use as a solder connection. It is apparent from the above above discussion that impurity elements other than antimony from the fifth group of the periodic table of elements can be used in the alloy. It is further apparent that, if the alloy is to be used to connect an etch-resistant strip to a pnp germanium transistor, an element from the third group of the periodic table, for example, gallium, can be substituted for the antimony to provide an alloy of p-type conductivity.

Continuing now with the description of FIGURE 3, junction bars 32 are inserted in the portion of each longitudinal slot 21 extending between the pairs of slots 22, the bars being chosen so that the p layers coincide in alignment with the slots 23. For the purpose of the immediate description, the bars 32 are npn germanium junction bars. Next, the dots 33, approximately .03″ in diameter and .015″ thick, are positioned on the grown junction bars in alignment with the slots 23 and, as a consequence, are in alignment with the p layers of the bars. The dots 33 are composed of indium when used in conjunction with the npn germanium junction bars. These dots of indium serve to make satisfactory connections to the intermediate p layers of junction bars, even when very thin, in accordance with the invention disclosed in the co-pending application of Morton E. Jones, United States patent application Serial No. 428,471, which was filed on May 10, 1954. The assembly in boat 20 is completed by positioning a platinum or gold-plated wire in the order of .005″ in diameter in the slots 23 thereby contacting each of the indium dots 33. By virtue of the position of wire 34 on the transistor bars 32 and indium dots 33, it is now apparent why slot 23 is cut to a much lesser depth in boat 20 than the slots 21 and 22. The use of an etch-resistant wire 34 in this transistor construction constitutes a novel and unique feature of this invention since, as been shown by the foregoing discussion of the prior art, it has been the common practice to attach the base lead connection to the intermedaite layer after the bar has already been etched.

After the components of FIGURE 3 have been assembled in the proper relationship in boat 20, the boat is placed in an oven and baked at a temperature varying from 525° C. to 560° C. depending upon the percentage of germanium in the gold alloy. In the baking operation, the components are fused into a series of transistors assembled in the "ladder" form 40 of FIGURE 4. As shown in this figure, the gold alloy tabs, now designated by the numeral 31*a*, have soldered the etch-resistant pairs of strips 30 to the npn junction bars 32. In like manner, the indium dots, now designated by the numeral 33*a*, have fused with the intermediate layer of the germanium bar and formed a p-type layer under the indium dot which is continuous with the p layer of the germanium bar. Since, in the baking process the etch-resistant wire 34 has become imbedded in each of the indium dots 33*a*, wire 34 is in contact with the p layer of each grown junction bar. The net result of the operations as described is to produce a large number of transistors in a single operation with the transistors being formed in a series of separate ladder assemblies throughout the length of boat 20. It is apparent, of course, that this method can be modified to produce single transistors rather than the ladders 40 if desired.

When the strips 30 and the wire 34 of the ladder assembly 40 are cut along the lines 35 of FIGURE 4, the transistors of FIGURE 5 designated generally by the numeral 41 are produced. The cut portions of strips 30 and wire 34 numbered as 30*a*, 30*b*, and 34*a* form the emitter, collector, and base leads respectively for transistor 41. The transistors 41 may then be introduced into a suitable etchant consisting, for example, of nitric acid, hydrofluoric acid, glacial acetic acid, and liquid bromine for the time required to remove the disordered layers of material from the surfaces of the transistor bars 32, which time varies from twenty to ninety seconds. The transistor assembles 41 are then removed from the etch, thoroughly rinsed and dried and completed as shown in FIGURE 6. In FIGURE 6, a header 45 supports the electrodes 47, 48, and 49 in spaced and sealed relationship by the glass material 46. The transistors 41 are placed so that the emitter strip 30*a* is in contact with electrode 47, the collector strip 30*b* is in contact with electrode 49, and the base lead 34*a* is in contact with electrode 48. A welding fixture spot welds the leads 30*a*, 30*b*, and 34*a* to the electrodes 47, 48, and 49 respectively in the same operation and the transistor is completed by first placing a sealing compound around the transistor bar 32, if desired, and then fitting a header can 50 over the entire assembly and soldering the header can 50 to header 45 to provide thereby a hermetic seal.

Instead of assembling the components of FIGURE 3 as described, the embodiment of FIGURES 7 and 8 illustrates a sub-assembly method which eliminates the step of placing the numerous gold alloy tabs 31 on the etch-resistant strips 30 at each of the intersections of the longitudinal slots 21 with the transverse slots 22. In FIGURE 7, a .002" thicksheet 55 of some etch-resistant material such as platinum is shown cut to the width of boat 20, for example, and to any convenient length. A number of gold alloy strips 56 are spaced in parallel relationship on sheet 55 at a distance apart which is equal to the distance between the longitudinal slots 21 of FIGURE 1. Sheet 55 with the gold alloy strips 56 in spaced relationship is then placed in an oven and heated to a temperature of approximately 450° C. hereby causing the strips 56 to stick but not completely fuse into the sheet 55. This is illustrated in FIGURE 8*a* where the gold alloy strips attached to the etch-resistant sheet 55 by this baking step are designated by the numeral 56*a*. When sheet 55 is cut along the equally spaced lines 57, strips 58 of FIGURE 8*b* aproximately .035" in width are produced with gold alloy tabs, designated by the numeral 56*b*, attached to the strip. To further illustrate the strips and tabs, a right-side elevational view of the strips 58 is shown in FIGURE 8*c*. When thus formed, the strips 58 can be placed in the pairs of transverse slots 22 and the ladder assemblies 40 produced by placing the transistor bars 32, the indium dots 33, and etch-resistant wires 34 in proper relationship on the strips 58.

The above discussion has been devoted to a method and apparatus for producing npn germanium transistors, but this method and apparatus with certain modifications applies equally to the production of npn silicon transistors. When it is desired to produce npn silicon transistors, the etch-resistant strips 30 shown in FIGURE 3 are first positioned in the transverse slots 22 and then gold alloy tabs similar to tabs 31 are placed on top of the etch-resistant strips at each intersection of the longitudinal slots 21 and the transverse slots 22. In the alternative, the etch-resistant strips can be produced with the gold alloy pre-attached as shown in FIGURES 7 and 8. Although the gold alloy used for silicon transistors has the same resistance to etching and ability to wet the components to be soldered as the alloy described above for germanium transistors, it differs in that, obviously, silicon replaces the germanium in the alloy and also in that the composition of the alloy is slightly different. It has been found that the most desirable results are obtained when the alloy is comprised of 6% silicon, 93% gold, and 1% antimony but the alloy composition may vary from 0% silicon 99.9% gold and 0.1% antimony to 8% silicon, 91% gold and 1% antimony and still provide satisfactory results.

Pure indium melts around 150° C. and, since the operating point of the silicon transistors is approximately that same temperature, it can be seen that indium is not a satisfactory material for use in attaching the base lead to the transistor. In the place of indium then, the dots 33 may be formed of pure aluminum, an alloy of 80% aluminum and 20% gallium, or an alloy of approximately 95% gold and 5% of either gallium, aluminum or indium to provide the necessary p-type conductivity. Using these dots 33, the bars 32, now npn silicon junction bars, and the etch-resistant wires 24, the components for npn silicon transistors can be assembled in boat 20 in the manner described above for the germanium transistors. Boat 20, with the components assembled in the proper relationship, is placed into an oven and baked at a temperature varying from 600° C. to 900° C. depending upon the percentage of silicon in the gold alloy. After fusing, ladder assemblies 40 identical to that shown in FIGURE 4 are produced which can then be sectioned along the lines 35, etched, and completed as shown in FIGURE 6.

It should be recognized at this point that, although the above description has been described in terms of materials and a method for manufacturing npn transistors, the etch-resistant strips 30 and wire 34 are equally applicable to pnp transistors and, with suitable changes in the impurity type of the gold alloy tabs 31 and the dots 33, the method described can be used to produce pnp transistors in complete form. For example, aluminum, gallium and indium may be used to produce a gold alloy of p-type conductivity and arsenic and antimony to produce dots 33 of n-type conductivity. Further, the materials disclosed herein are equally applicable to the construction of other semiconductor devices such as diodes, and consequently, the foregoing description is not to be considered as a limitation on this invention.

While it is possible to produce transistors in large numbers either by first assembling the transistor components in the proper relationship or by producing sub-assemblies of the components and subsequently assembling the remainder and then fusing the assembled components in the same operation, the materials of this invention and the features discussed above lend themselves very conveniently to a continuous transistor production process. To illustrate the method of producing transistors in a continuous process, reference is made first to FIGURE 9*a*. FIGURE 9*a* represents as part of a roll of etch-resistant material, which may be either platinum or some other suitable gold-plated material, a strip 60 with a width equal to the length of a transistor junction bar. Since equipment in any number of different forms can be devised to perform the steps of continuously producing transistors, only one sequence of operation will be shown and described as illustrative of the continuous production process of this invention.

Strip 60 is moved in the direction of the arrows and, as strip 60 moves, a thin strip 62 of indium is fed to the underneath side of strip 60 and at right angles to the longitudinal axis of the strip. After strip 60 has moved for a distance of approximately .03", a thin strip 61 of gold alloy is fed to the top side of strip 60 and at right angles to the longitudinal axis of strip 60. As strip 60 continues to move, additional strips 62 of indium strips 61 of the gold alloy are positioned underneath and on the top side of the strip respectively and at equally spaced intervals along the strip. During the entire process of placing the indium and gold strips in contact with strip 60, a localized source of heat is applied, such as by induction generation or by electrical resistance welding, to tack continuously the strips of indium and gold alloy to strip 60.

With the indium and gold alloy strips attached to the strip 60, the next step in the process is illustrated in FIGURE 9*b*. FIGURE 9*b* represents a segement of strip 60 and the operation performed on this segment is performed on each subsequent and similar segment of the strip. In the step of FIGURE 9*b*, a portion of the segment designated by the numeral 63 is punched out leaving the T-shaped section 64 and the narrow strips 65 and 66 along each outer edge. Punched in this manner, the indium 62*a* is left on the under side of the cross bar of T-section 64 and the gold alloy tabs 61*a* are left only on the upper sides of the narrow strips 65 and 66. The indium portions 62*b* remain on the under sides of strips 65 and 66 but serve no purpose in the production of transistors. After the punching operation of FIGURE 9*b*, the next step to be performed on this segment and each subsequent segment of strip 60 is the forming operation of FIGURE 9*c*. The forming operation is performed on the outer strips 65 and 66 and acts to fold the gold alloy tabs 61*a* into the pockets 67 and 68 in strips 65 and 66 respectively. Thus formed, the gold alloy is in alignment in a vertical plane with the indium on the under side of the cross bar of T-section 64.

In the next step illustrated by FIGURE 9*d*, a mechanism containing a number of npn germanium bars 69 simultaneously lifts the T-section 64 and positions a bar 69 in the pockets 67 and 68 so that the n-type layers of the bar are in contact with the gold alloy tabs 61a and the p layer is in contact with the indium on the under side of the cross bar of T-section 64. With the junction bar 69 in place, heat is then applied at a temperature of from 525° C. to 560° C. depending upon the composition of the gold alloy which causes the gold alloy 61a and indium 62a to solder strips 65 and 66 and T-section 64 respectively to bar 69. After the fusing process, the segment of strip 60 is sheared along the lines 70 and 71 to produce the npn transistor designated generally by the numeral 72.

As shown in FIGURE 9e, transistor 72 consists of the bar 69 with the T-section 64 soldered to one side of bar 69 by the indium strip 62a. The fact that the indium section extends on either side of the p layer is immaterial in the operation of the transistor since, as has been described above, the portion of the transistor bar directly underneath the indium has been converted into a p layer continuous with the p layer of the transistor bar. On the opposite side of the bar from T-section 64 and at either end are the strips 65 and 66 soldered to bar 69 by the gold alloy tabs 61a. Transistor 72 in this form can then be etched and subsequently completed by the header and header can assembly shown in FIGURE 6. The continuous production process, like the boat loading and single fusing method, can be modified in much the same manner to produce npn silicon transistors as well as pnp germanium and silicon transistors.

Numerous changes and modifications to the apparatus and methods as disclosed herein will be readily apparent to persons skilled in the semiconductor art. Accordingly, it is the intention of this invention to claim the use of the disclosed etch-resistant materials and alloys with any semiconductor device and the application of the methods of this invention to the production of semiconductor devices when such use and application are within the scope of the appended claims.

What is claimed is:

1. A method of mass manufacturing semiconductor devices comprising the steps of positioning a pair of etch-resistant leads in spaced parallel relationship, spacing a plurality of etch-resistant alloy solder tabs along each of said leads, positioning a plurality of semiconductor bodies in connecting relation between said pair of leads whereby said alloy tabs are interposed between said semiconductor bodies and said leads, laying a dot of material on each of said plurality of semiconductor bodies, connecting said dots by another etch-resistant lead, fusing the components into a single assembly, and thereafter separating said assembly into a plurality of semiconductor devices which can be etched without masking.

2. A method of mass manufacturing semiconductor devices comprising the steps of positioning a plurality of pairs of etch-resistant leads in spaced parallel relationship, spacing a plurality of etch-resistant alloy solder tabs along each of said pairs of leads, positioning a plurality of semiconductor bodies in connecting relation between each pair of leads in said plurality of pairs whereby said alloy tabs are interposed between said semiconductor bodies and said leads, laying a dot of material on each of said semiconductor bodies, connecting said dots by another etch-resistant lead for each pair of leads, fusing the components into a plurality of single assemblies, and thereafter separating the said assemblies into a plurality of semiconductor devices which can be etched without masking.

3. A method of mass manufacturing npn junction transistors comprising the steps of positioning pairs of etch-resistant leads in spaced parallel relationship, spacing a plurality of etch-resistant gold alloy solder tabs of n-type conductivity along each of said leads, positioning a plurality of npn junction bars in connecting relation between said pairs of leads whereby said gold alloy tabs are interposed between said junction bars and said leads, laying a dot of p-type impurity material on each of said junction bars, connecting said p-type dots by one other etch-resistant lead for each pair of leads, fusing the components into single assemblies, separating said assemblies into a plurality of npn transistors, and thereafter etching said transistors without masking.

4. A method of mass manufacturing pnp transistors comprising the steps of positioning pairs of etch-resistant leads in spaced parallel relationship, spacing a plurality of etch-resistant gold alloy solder tabs of p-type conductivity along each of said leads, positioning a plurality of pnp junction bars in connecting relation between said pairs of leads whereby said gold alloy tabs are interposed between said junction bars and said leads, laying a dot of n-type material on each of said junction bars, connecting said n-type dots by one other etch-resistant lead for each pair of leads, fusing the components into single assemblies, separating said assemblies into a plurality of pnp transistors, and thereafter etching said transistors without masking.

References Cited in the file of this patent

UNITED STATES PATENTS

| | | |
|---|---|---|
| 1,731,212 | Davingnon | Oct. 8, 1929 |
| 2,137,831 | Brunke | Nov. 22, 1938 |
| 2,400,003 | Henzel et al. | May 7, 1946 |
| 2,603,693 | Kircher | July 15, 1952 |
| 2,644,852 | Dunlap | July 7, 1953 |
| 2,697,052 | Dacey et al. | Dec. 14, 1954 |
| 2,701,326 | Pfann et al. | Feb. 1, 1955 |
| 2,705,767 | Hall | Apr. 5, 1955 |
| 2,711,511 | Pietenpol | June 21, 1955 |
| 2,717,343 | Hall | Sept. 6, 1955 |
| 2,736,847 | Barnes | Feb. 28, 1956 |
| 2,757,324 | Pearson | July 31, 1956 |
| 2,765,245 | English | Oct. 2, 1956 |
| 2,777,974 | Brattain et al. | Jan. 15, 1957 |
| 2,810,873 | Knott | Sept. 22, 1957 |
| 2,814,853 | Paskell | Dec. 3, 1957 |
| 2,840,885 | Cressell | July 1, 1958 |

FOREIGN PATENTS

| | | |
|---|---|---|
| 523,638 | Belgium | Nov. 14, 1953 |